United States Patent [19]

MacDonald et al.

[11] Patent Number: 5,316,979

[45] Date of Patent: * May 31, 1994

[54] RIE PROCESS FOR FABRICATING SUBMICRON, SILICON ELECTROMECHANICAL STRUCTURES

[75] Inventors: Noel C. MacDonald; Zuoying L. Zhang, both of Ithaca, N.Y.

[73] Assignee: Cornell Research Foundation, Inc., Ithaca, N.Y.

[*] Notice: The portion of the term of this patent subsequent to Mar. 30, 2010 has been disclaimed.

[21] Appl. No.: 38,879

[22] Filed: Mar. 29, 1993

Related U.S. Application Data

[63] Continuation of Ser. No. 821,944, Jan. 16, 1992, Pat. No. 5,198,390.

[51] Int. Cl.$^5$ .................... H01L 21/44; H01L 21/48; H01L 21/90
[52] U.S. Cl. ................... 437/203; 437/225; 437/228; 148/DIG. 50; 148/DIG. 51
[58] Field of Search .................... 437/203, 225, 228; 148/DIG. 50, DIG. 51; 156/643

[56] References Cited

U.S. PATENT DOCUMENTS

| | | |
|---|---|---|
| 3,672,985 | 6/1972 | Nathanson et al. |
| 4,437,226 | 3/1984 | Soclof .................... 148/DIG. 51 |
| 4,670,092 | 6/1987 | Motamedi . |
| 4,685,198 | 8/1987 | Kawakita et al. .......... 148/DIG. 50 |
| 4,740,410 | 4/1988 | Muller et al. . |
| 4,776,924 | 10/1988 | Delapierre . |
| 4,783,821 | 11/1988 | Muller et al. . |
| 4,845,048 | 7/1989 | Tamaki et al. .............. 148/DIG. 51 |
| 4,853,348 | 8/1989 | Tsubouchi et al. ................ 437/203 |
| 4,980,317 | 12/1990 | Koblinger et al. ......... 148/DIG. 51 |
| 5,072,288 | 12/1991 | MacDonald et al. . |

OTHER PUBLICATIONS

"Anisotropic Reactive Ion Etching of Aluminum Using Cl$_2$, BCl$_3$, and CH$_4$ Gases" Lutze et al, J. Electrochem. Soc. vol. 137, No. 1, Jan. 1990 pp. 249–252.

"Anistotropic Reactive Ion Etching of MoSi$_2$ and In Situ Doped n+ and p+ Polysilicon Using Cl$_2$ and BCl$_3$" Mele et al, J. Electrochem. Soc.: Solid–State Science and Technology, Sep. 1988, pp. 2373–2378.

"Nanostructures in Motion" Yao et al, Nanostructures and Mesoscopic Systems Wiley P. Kirk and Mark Reed, Eds. Academic Press, Dec. 1991, pp. 1–9.

"Fabrication of High Frequency Two-Dimensional Nanoactuators for Scanned Probe Devices", Yao et al Journal of Microelectromechanical Systems, vol. 1, No. 1, Mar. 1992, pp. 14–22.

"Formation of Submicron Silicon-On-Insulator Structures by Lateral Oxidation of Substrate-Silicon Islands" Arney et al, J. Vac. Sci. Technol. B 6 (1) Jan./Feb. 1988, pp. 341–345.

"New SOI CMOS Process with Selective Oxidation" Kubota et al IEDM 86, pp. 814–816.

*Primary Examiner*—William Powell
*Assistant Examiner*—Kevin M. Picardat
*Attorney, Agent, or Firm*—Jones, Tullar & Cooper

[57] ABSTRACT

A reactive ion etching process is used for the fabrication of submicron, single crystal silicon, movable mechanical structures and capacitive actuators. The reactive ion etching process gives excellent control of lateral dimensions while maintaining a large vertical depth in the formation of high aspect-ratio freely suspended single crystal silicon structures. The silicon etch process is independent of crystal orientation and produces controllable vertical profiles.

7 Claims, 1 Drawing Sheet

RIE PROCESS FOR FABRICATING SUBMICRON, SILICON ELECTROMECHANICAL STRUCTURES

This invention was made with Government support under Grant Nos. ECS-8805866 and ECS-8815775, awarded by the National Science Foundation. The Government has certain rights in the invention.

This is a continuation of copending application Ser. No. 821,944 filed Jan. 16, 1992, now U.S. Pat. No. 5,198,390.

BACKGROUND OF THE INVENTION

The present invention relates, in general, to a new process for the fabrication of submicron, single crystal silicon, movable mechanical structures, and more particularly to a simplified reactive ion etching (RIE) process which is independent of crystal orientation and which produces controllable vertical profiles in the silicon.

Recent developments in micromechanics have successfully led to the fabrication of microactuators utilizing processes which have involved either bulk or surface micromachining. The most popular surface micromachining process has used polysilicon as the structural layer in which the mechanical structures are formed. For such a polysilicon process, a sacrificial layer is deposited on a silicon substrate prior to the deposition of the polysilicon layer. The mechanical structures are defined in the polysilicon, and then the sacrificial layer is etched partially or completely down to the silicon substrate to free the polysilicon movable mechanical structures. The present polysilicon technology is not easily scaled for the formation of submicron, high aspect-ratio mechanical structures, because it is difficult to deposit fine-grain polysilicon films to the required thickness.

Some bulk micromachining processes can yield mechanical single crystal silicon structures using wet chemical etchants such as EDP, KOH, and hydrazine to undercut single crystal silicon structures from a silicon wafer. However, such processes are dependent on crystal orientation within the silicon wafer, and for this and other reasons the type, shape and size of the structures that can be fabricated with the wet chemical etch techniques are severely limited.

The use of single-crystal materials for mechanical structures can be beneficial, since these materials have fewer defects, no grain boundaries and therefore should scale to submicron dimensions and retain their structural and mechanical properties. Also, the use of single-crystal materials, particularly single crystal silicon and gallium arsenide, to produce mechanical sensors and actuators can facilitate and optimize electronic and photonic system integration. For example, single crystal silicon (SCS) structures having a very small mass, in the range of $2 \times 10^{13}$ kgm, can resonate without failure at 5 MHz for 2 billion cycles with a vibrational amplitude of plus or minus 200 nm. Accordingly, the fabrication of submicron mechanical structures with high aspect ratios is highly desirable.

SUMMARY OF THE INVENTION

It is, therefore, an object of the present invention to provide suspended, single crystal silicons mechanical structures and actuators utilizing a new fabrication technique.

It is another object of the invention to fabricate high aspect-ratio, single crystal mechanical structures having feature sizes as small as 250 nm and wherein the structures may have any arbitrary structural orientation on a silicon wafer.

A still further object of the present invention is to provide a new reactive ion etching process to produce single crystal silicon mechanical structures and actuators having feature sizes in the range of 250 nm are produced.

A still further object of the invention is to provide suspended, SCS micro-mechanical structures and actuators having integrated, side-drive capacitor actuators formed through a metallization process which complements the silicon RIE processes used to form the movable SCS structures.

Briefly, the present invention is directed to a new and unique process sequence for fabricating suspended, single crystal silicon micro-mechanical structures and actuators. The process, known as a single crystal reactive etch and metallization process (SCREAM), provides a significant advantage in the manufacture of such structures since no thick film deposition process is required. Instead, reactive ion etching (RIE) processes are used to fabricate released SCS structures with lateral feature sizes down to 250 nm and with arbitrary structure orientation on an SCS wafer. The SCREAM process includes options to make integrated, side-drive capacitor actuators, the capacitor actuators being formed by means of a compatible high step-coverage metallization process using aluminum sputter deposition and isotropic aluminum dry etching. The metallization process is used to form side-drive electrodes and complements the silicon RIE processes used to form these structures.

In general, the SCREAM process defines mechanical structures with one mask, with the structures being etched from a substrate. In one embodiment of the invention, the starting substrate is a silicon wafer on which a layer of silicon dioxide approximately 400 nm thick is thermally grown, this material then being available for use as an etch mask. The pattern to produce free standing SCS structures is created using photolithography in a photoresist spun on the silicon dioxide layer, and this photoresist pattern is transferred to the silicon dioxide by a reactive ion etching step. The photoresist is then stripped and the silicon dioxide pattern is transferred to the silicon substrate using a second RIE process, forming trenches and islands in accordance with the desired structural features in the silicon. Thereafter, contact windows may be opened in the silicon dioxide to allow electrical contact to both the silicon substrate and the movable silicon structures, and thereafter a 400 nm layer of aluminum is conformally deposited using DC magnetron sputter deposition. This aluminum makes electrical contact with the silicon substrate and with the movable silicon structures through the contact windows, while the remainder is deposited on the silicon dioxide layer. A photoresist is used to re-fill the etched silicon trenches following this aluminum sputter deposition and thereafter aluminum side electrode patterns are produced in the photoresist through the use of photolithography. This pattern is then transferred to the aluminum layer by means of an isotropic RIE, with the photolithography and the RIE steps producing smooth edges on the aluminum pattern.

After the aluminum electrodes are patterned, an etching step removes the silicon dioxide on the bottoms of the trenches, while leaving the silicon dioxide on the top and side walls of the structures previously defined in the substrate. The silicon mechanical structures are released from the silicon substrate using a further RIE process, with the top and side walls of the structures being protected by the silicon dioxide mask during undercutting. Finally, the resist which was used for the aluminum patterning is stripped from the structure by a suitable plasma etch.

The foregoing process can be used to fabricate complex shapes, including circular, triangular and rectangular structures, in single crystal silicon. Such structures can include integrated, high aspect-ratio and conformable capacitor actuators, as required. Thus, it is possible to form suspended SCS structures with complex shapes from a silicon wafer through a simplified RIE process.

BRIEF DESCRIPTION OF THE DRAWINGS

The foregoing and additional objects, features and advantages of the present invention will become apparent to those of skill in the art from the following more detailed description of the invention taken in conjunction with the accompanying drawings, in which.

DESCRIPTION OF PREFERRED EMBODIMENTS

In accordance with the present invention a single crystal reactive etch and metallization process is used to fabricate a variety of complex circular, triangular or rectangular structures in single crystal silicon. In this process, mechanical structures are defined with one mask and are then etched from a silicon wafer. The process steps of the invention for fabricating single crystal silicon electro-mechanical structures are diagrammatically illustrated in FIGS. 1A through 1F, to which reference is now made. These figures show the process sequence for the fabrication of a straight cantilever beam and integrated aluminum electrodes adjacent each side of the beam, but it will be understood that various other shapes can be fabricated by the same process.

Figure 1A:
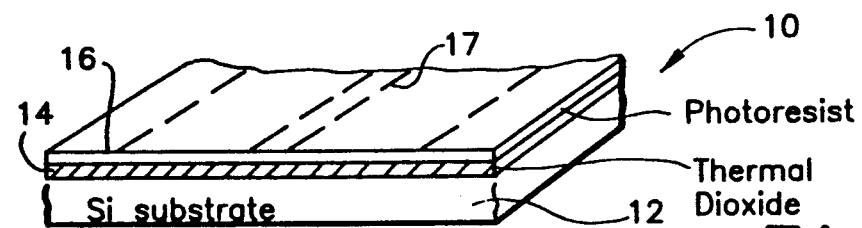
FIGS. 1A–1F illustrate in diagrammatic form the fabrication of a silicon cantilever beam from a silicon wafer and the provision of aluminum electrodes thereon, the process utilizing silicon dioxide for electrical insulation and for providing top and sidewall etching masks.

As illustrated in FIG. 1A, the starting substrate 10 includes, in a preferred form of the invention, an arsenic doped, 0.005 ohm-cm, N-type (100) silicon wafer 12. A layer of silicon dioxide 14 which may be 400 nm thick, for example, is thermally grown on the top surface of silicon wafer 12. This silicon dioxide layer 14 is used as an etch mask, and accordingly this layer is patterned in the shape of the desired mechanical structure. This is done utilizing a conventional photolithographic process on a photoresist layer 16 which is spun onto the silicon dioxide layer 14. The desired pattern 17 is photolithographically produced in the photoresist layer 16, as indicated by dotted lines in FIG. 1A, with a minimum lateral feature size for the structure, such as the cantilever beam structure defined by this process, being 400 nm.

Figure 1B:
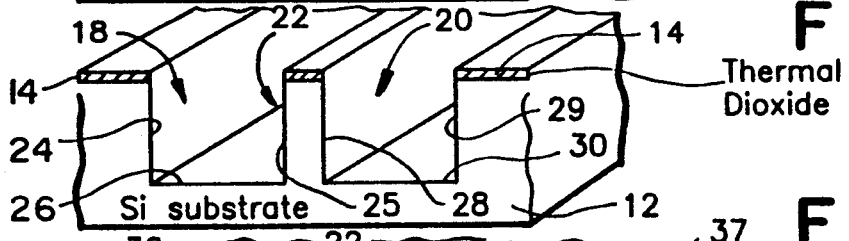

As illustrated in FIG. 1B, the photoresist pattern 17 is transferred to the silicon dioxide layer 14 by reactive ion etching (RIE) in a CHF$_3$ plasma. The photoresist layer 16 is then stripped, using an O$_2$ barrel asher, and the pattern in the silicon dioxide layer 14 is subsequently transferred to the silicon substrate 12 using a Cl$_2$/BCl$_3$ reactive ion etching process. The etch depth in the illustrated embodiment is 3.5 micrometers and the process leaves a 320 nm thick silicon dioxide layer 14 on the top of the silicon steps. As illustrated, the etch mask defines a pair of trenches 18 and 20 in the surrounding silicon, the trenches being disposed on opposite sides of an island 22 and defining the width, length, depth and shape of the island. The RIE etching process produces vertical, opposed side walls 24 and 25 and a bottom wall 26 defining trench 18 and vertical, opposed side walls 28 and 29 and bottom wall 30 defining trench 20, with walls 25 and 28 defining the island 22, from which the cantilever beam is to be formed. The trenches produce a stepped top surface on the silicon wafer 12.

Figure 1C:
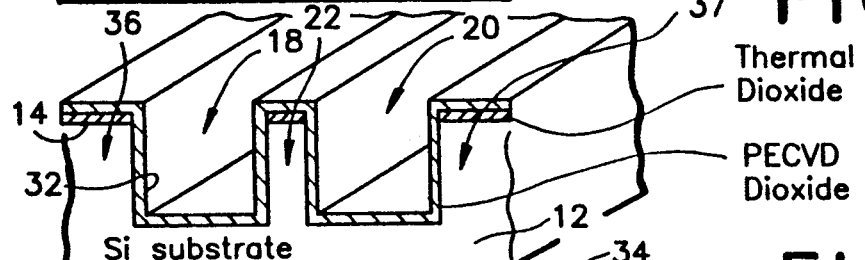

Following the silicon etch of FIG. 1B, a side wall silicon dioxide layer 32 is thermally grown in a conventional furnace at 1000° C. to cover all of the exposed surfaces. Thus, as illustrated in FIG. 1C, layer 32 covers the silicon dioxide layer 14 on the horizontal top surface of the wafer 10, covers the bottom walls 26 and 30 and covers the side walls 24, 25, 28 and 29 of trenches 18 and 20. The oxidation process consumes a portion of the silicon material 12, thereby reducing the thickness of the island 22 between walls 25 and 28 and at the same time increasing the distance between walls 24 and 25 and between walls 28 and 29. This reduction of the lateral dimensions of the single crystal silicon structure, by consumption of some of the surface material, reduces the effect of any damage to the side walls that might have been caused during the Cl$_2$/BCl$_3$ etching process described above with respect to FIG. 1B.

Figure 1D:
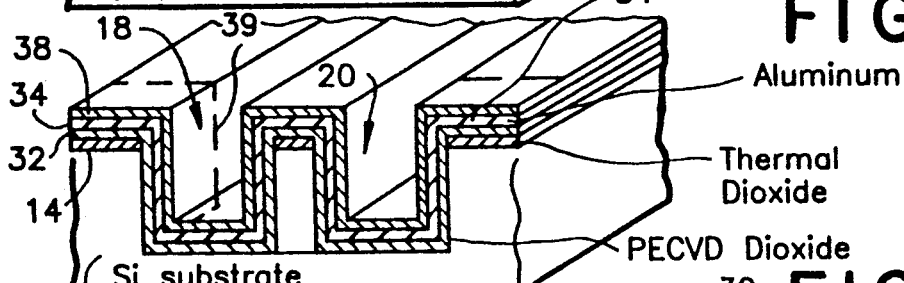

As illustrated in FIG. 1D, the next step in the fabrication process is the deposition of a 400 nm thick layer 34 of aluminum. This layer is conformally deposited over all of the exposed surfaces by means of, for example, DC magnetron sputter deposition. This layer of aluminum covers the silicon dioxide layer 32.

Although in FIG. 1D the aluminum layer 34 is shown as being deposited over the silicon dioxide layer 32, it may be desirable to provide selected contact windows, or apertures, in the silicon dioxide layer 32 prior to the aluminum deposition step. Such windows can be formed by means of a second photoresist and photolithographic step (not illustrated) to pattern the location of points where electrical contact is to be made with the underlying silicon substrate 12, and by etching through the silicon dioxide layer 32 (and layer 14 where required), to expose the silicon substrate at desired locations. Thereafter, when the aluminum layer 34 is deposited on the wafer 10, the aluminum will make electrical contact with the silicon substrate through these defined windows. Such contact can be made on the island 22 or on the adjacent silicon steps generally indicated at 36 and 37.

After the aluminum layer 34 has been deposited, a photoresist material 38 is applied to the wafer to re-fill the etched silicon trenches 18 and 20 (FIG. 1D). The photoresist material is patterned through conventional photolithography and the pattern 39 is transferred to the aluminum layer 34 from the resist by an isotropic reactive ion etching step using a Cl$_2$/BCl$_3$ plasma. This patterning and etching, process leaves aluminum electrodes such as the electrodes 40 and 42 on the walls 24 and 29, respectively (FIG. 1E) while removing the aluminum from remaining surfaces. The photolithography and the Cl$_2$ reactive ion etching steps produce smooth edges on the aluminum contact regions over the topography of the wafer, which may include any number of trenches such as trenches 18 and 20. This process removes the aluminum isotropically where the photoresist pattern had been developed.

Figure 1E:
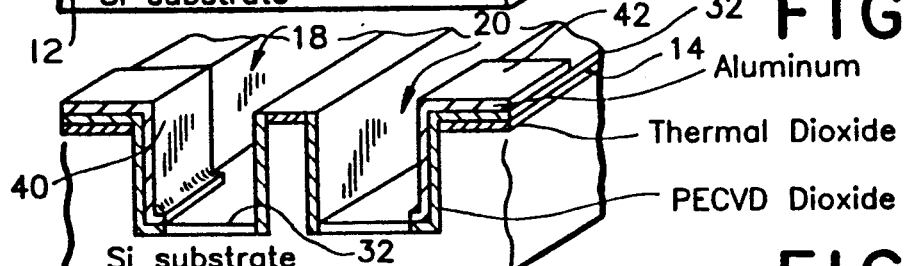
Figure 1F:
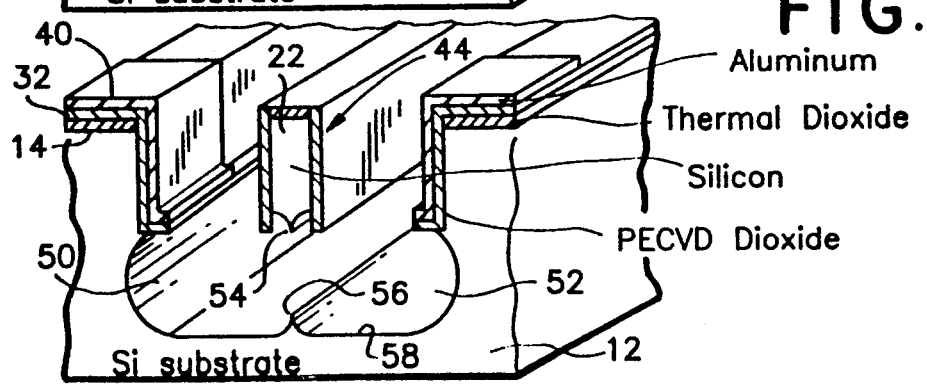

Upon completion of the patterning and formation of the aluminum electrodes illustrated in FIG. 1E, a $CF_4$ plasma is used to etch the exposed silicon dioxide layer 32 on the bottom walls 26 and 30 of the trenches, while leaving the silicon dioxide on the top surfaces of the steps 36 and 37 and on the side walls 24, 25, 28 and 29. Upon removal of the silicon dioxide layer 32 from the bottom walls 26 and 30, an $SF_6/O_2$ reactive ion etching process is used to undercut the island 22 by etching back the silicon substrate 12 at the bottoms of the trenches. This process undercuts the island 22 below the protective mask provided by the silicon dioxide layer 32 on walls 25 and 28 to thereby release the island 22 to form cantilever beam structure such as the released beam 44 generally indicated in FIG. 1F. The undercutting process produces undercut cavities 50 and 52 in the silicon substrate material 12, the undercutting action producing opposed, spaced ridges 54 and 56 on the bottom of beam 44 and on the bottom surface 58 of the cavities. As noted, the cavities are formed through the adjoining trenches 18 and 20 with the etching process continuing beneath the protective layers of the silicon dioxide 32 on the side walls to undercut not only the island 22 to form the released beam 44, but also to undercut the side walls 24 and 29, as illustrated in FIG. 1F.

As a final step, the photoresist used for the aluminum patterning is stripped by an $O_2$ plasma etch.

The contact plates formed by the foregoing process, such as the plates 40 and 42, may be used as capacitor plates to form conformable capacitor actuators for the beam 44. These capacitor plates can be formed at any desired location along the length of the beam and on the opposed side walls for control of the operation of the beam or for sensing its motion. Such contacts can be used in a variety of locations for controlling or sensing the motion of a wide range of mechanical structures.

The silicon etch process described above is independent of crystal orientation, so that the vertical profiles of walls are controllable to permit the formation of high aspect-ratio freely suspended single crystal silicon microstructures. The process provides excellent control of lateral dimensions (0.2 μm to about 2 μm) while permitting a large vertical depth (1 μm to about 4 μm). The process also incorporates steps which allow formation of vertical, 4 μm deep, aluminum capacitor plates for use as actuators or motion sensors. Two-dimensional x-y micro-stages and circular SCS structures have been fabricated using this process, and such devices have produced a displacement of ±6 μm in x and y directions with the application of 40v DC to either or both x-y actuators. The process permits the use of stiffness as low as $10^{-2}$ N/m in the released structure.

It will be apparent to those of skill in the art that variations and modifications may be made in the foregoing process, without departing from the true spirit and scope of the invention. For example, although the invention has been described with respect to a single crystal silicon material, other materials such as gallium arsenide may be used.

What is claimed is:

1. A reactive ion etching process for fabricating a high aspect ratio, submicron, released, single crystal silicon electromechanical structure independently of crystal orientation, comprising:
   forming a patterned etch mask on a top surface of a single crystal silicon substrate, the etch mask defining a structure of arbitrary shape to be formed in said substrate, said shape being independent of crystal orientation in said substrate;
   transferring the pattern of said etch mask to said substrate and forming by reactive ion etching trenches defining the structure to be fabricated in the substrate, said etching step forming trenches having bottom walls and vertical side walls;
   forming an electrically insulating silicon dioxide layer on exposed surfaces of said silicon substrate, the exposed surfaces including said vertical side walls of said trenches;
   forming metal electrodes on selected portions of said vertical side walls;
   selectively removing said silicon dioxide insulating layer from said bottom walls of said trenches to expose said single crystal silicon substrate; and
   reactive ion etching the exposed bottom wall substrate to undercut and to mechanically release said defined structure from said substrate to thereby produce a high aspect ratio, released, single crystal silicon structure having vertical side walls, said released structure being relatively movable with respect to said substrate.

2. The process of claim 1, wherein the step of forming metal electrodes includes depositing on said silicon dioxide layer a conformal layer of metal;
   producing an electrode pattern on said layer of metal; and
   selectively removing said deposited metal to produce said electrodes on at least selected portions of said vertical side walls.

3. The process of claim 2, wherein the step of forming a patterned etch mask includes reactive ion etching of a silicon dioxide mask layer on the surface of said substrate through a patterned photoresist material.

4. The process of claim 3, wherein the step of transferring the pattern of said etch mask to said substrate includes reactive ion etching of said mask.

5. The process of claim 4, wherein the step of reactive ion etching said substrate to form said trenches includes $Cl_2BCl_3$ reactive ion etching.

6. The process of claim 5, wherein the step of undercutting and releasing said defined structure includes $SF_6/O_2$ reactive ion etching.

7. The process of claim 6, wherein the step of depositing a conformal layer of metal includes sputter deposition of aluminum.

* * * * *